United States Patent
Ohya et al.

(10) Patent No.: US 6,849,522 B2
(45) Date of Patent: Feb. 1, 2005

(54) METHOD OF PRESS-WORKING INORGANIC SUBSTRATE AND PRESS MACHINE THEREFOR

(75) Inventors: Kazuyuki Ohya, Tokyo (JP); Norio Sayama, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 214 days.

(21) Appl. No.: 10/025,889

(22) Filed: Dec. 26, 2001

(65) Prior Publication Data

US 2002/0083849 A1 Jul. 4, 2002

(30) Foreign Application Priority Data

Dec. 28, 2000 (JP) ........................................ 2000-401078

(51) Int. Cl.$^7$ .......................... H01L 21/30; H01L 21/46
(52) U.S. Cl. ........................................ 438/455; 438/479
(58) Field of Search ............................ 438/455; 100/92

(56) References Cited

U.S. PATENT DOCUMENTS 4,054,478 A * 10/1977 Linnon ........................ 156/242
5,522,478 A * 6/1996 Diekwisch ................... 187/273
6,008,113 A * 12/1999 Ismail et al. ................. 438/615
6,036,872 A * 3/2000 Wood et al. .................... 216/2

* cited by examiner

Primary Examiner—John F. Niebling
Assistant Examiner—Angel Roman
(74) Attorney, Agent, or Firm—Wenderoth, Lind & Ponack, L.L.P.

(57) ABSTRACT

A method of press-working an inorganic substrate, which method uses a vacuum press machine having an air plunger type pressurization system and comprises bringing upper and lower heat plates which have been heated up to a predetermined temperature into contact with a combination set disposed between the upper and lower heat plates after or before the initiation of pressure reduction of a press atmosphere or under a reduced pressure and then carrying out a low pressure loading of from the initiation of pressurization to 0.05 Mpa over 10 seconds or longer and a press machine which is suitable for the above press-working method and which can set and control a low-pressure of 0.02 MPa or lower and comprises an air plunger that works as an air damper when the upper heat plate descends.

5 Claims, 1 Drawing Sheet

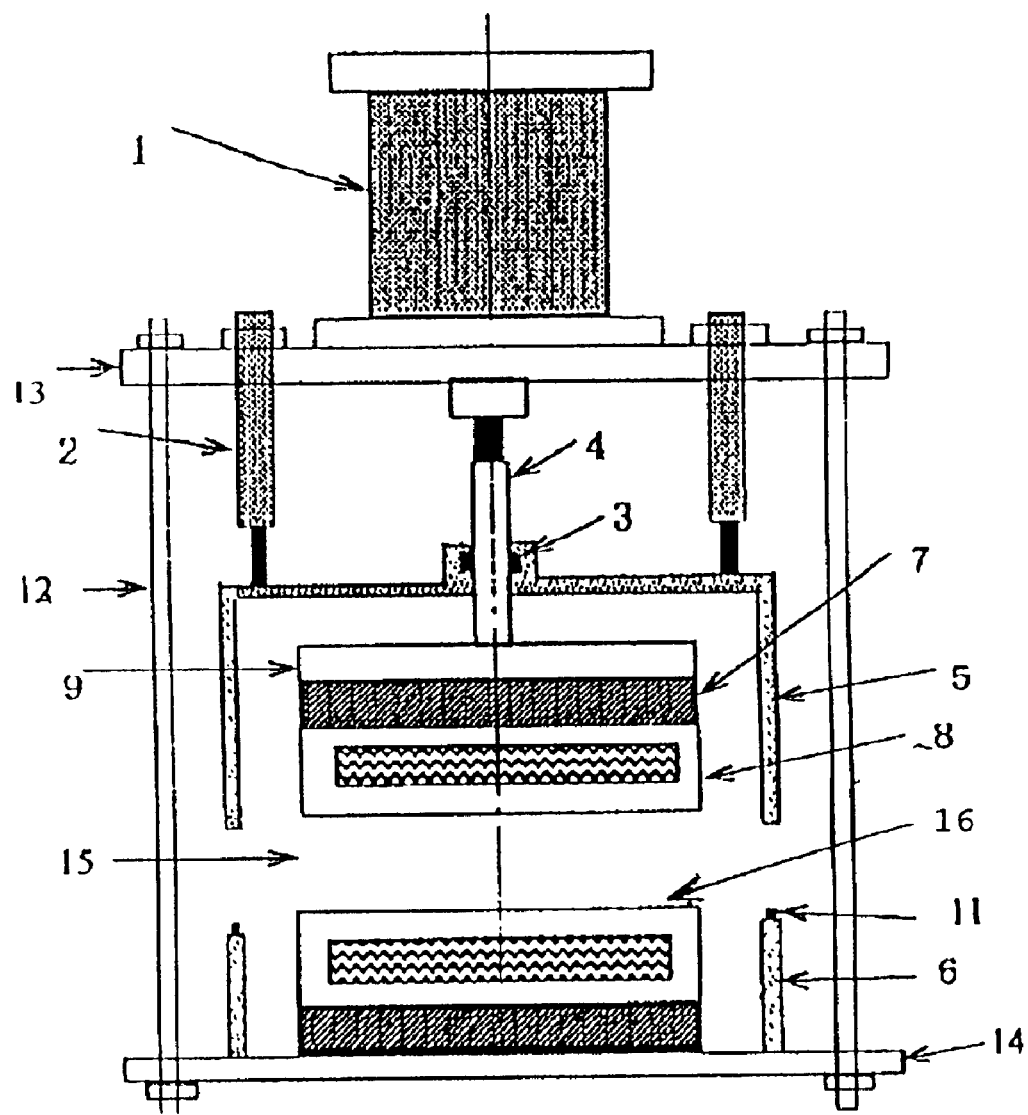

METHOD OF PRESS-WORKING INORGANIC SUBSTRATE AND PRESS MACHINE THEREFOR

FIELD OF THE INVENTION

The present invention relates to a method of press-working an inorganic substrate formed of a semiconductor substrate or a ceramic. Particularly, it relates to a method of press-working and a press machine which are suitable for grinding the non-processed surface of a single-side processed semiconductor substrate to thin the single-side processed semiconductor substrate and bonding and holding the single-side processed semiconductor substrate to/on a holding substrate in order to carry out the metallization of the above surface or other workings as required.

DESCRIPTION OF PRIOR ARTS

In recent years, electronic devices have been desired to be decreased in thickness or in weight. As is typified by a portable telephone or an IC card, electric devices are decreasing in thickness.

As a thin printed wiring board, printed wiring boards using a wholly aromatic polyamide paper as a base material and printed wiring boards using a polyimide film are increasing.

Further, a ceramic substrate also needs to have a thickness of 0.2 mm or less, 0.1 mm, 0.05 mm, 0.03 mm, etc. However, generally, a ceramic is hard and the shape thereof is not altered. Ceramics other than exceptions such as a flexible thin glass plate have a problem that ceramics crack easily when thinned. For this reason, for example, the maximum work size of a ceramic substrate according to a thin film method is a thickness of 0.2 mm and a size of 50 mm×50 mm.

Similarly, an electronic part itself is decreasing in thickness. The decrease in thickness results from requirements of miniaturization and performance-enhancement.

In view of productivity improvement, developments of a silicon wafer (metal) for enlarging the work size thereof from 8 inches to 12 inches are vigorously being made. Since there is no method for forming electronic circuits including metal on both surfaces concurrently in the current production step, it is required to form electronic circuits on one surface and then form electronic circuits on the other surface. Further, a thermal expansion coefficient difference between metal to be used such as copper or aluminum and a semiconductor substrate is large or $10\sim15\times10^{-6}K^{-1}$. When electronic circuits are formed on a semiconductor substrate which has been already thinned, warps occurs so that in some cases it is impossible to carry out the next step or a breakage occurs.

When a semiconductor part in which semiconductor circuits are formed on both surfaces of a thin semiconductor substrate is produced, it is required to adopt a production method in which after the formation of a semiconductor or other electronic circuit parts at high temperatures, including the introduction of impurities, on one surface (front surface or surface A) of a semiconductor substrate having a general thickness, the above one surface is brought into intimate contact with a holding substrate and held on the holding substrate to protect the one surface, exposed opposite surface (back surface or surface B) is polished to thin the semiconductor substrate, then semiconductor circuits for the back surface are formed as required, and the semiconductor substrate is separated from the holding substrate and then cut to a chip size or the semiconductor substrate is cut to obtain respective pieces of a chip size and then the respective pieces are separated from the holding substrate.

When the step for forming electronic circuits for the back surface is only a metallization for balancing a thermal expansion coefficient difference, a high temperature treatment step is not specially required. However, when semiconductor circuits are formed, a high temperature of approximately 350° C. or higher is required and it is required that a holding under such a vacuum that a plasma treatment or ion plating at the above high temperature is possible, is possible.

Further, even when no high temperature treatment is required, the kind of a usable adhesive resin or the kind of a holding substrate are greatly limited depending upon a chemical to be used.

Furthermore, since the semiconductor substrate is fragile, there is necessarily required a method which causes no cracks at a step of bonding and holding the semiconductor substrate to/on the holding substrate and at a step of separating the semiconductor substrate from the holding substrate.

It is extremely difficult to find a means which overcomes the above problems at a time.

From this respect, for example, when a highly reproducible bonding and holding method is developed, a highly reliable bonding and holding restricted to a necessary period of time or a necessary step and a following easy separation are enabled by a selection of conditions. Further, when the range of usable adhesive resins is broadened, the selection possibility of an appropriate balance between necessary physical properties and separability is considerably broadened.

SUMMARY OF THE INVENTION

It is an object of the present invention to provide a method of bonding and holding which method causes no cracks and has high reproducibility.

According to the present invention, first, there is provided a method of press-working an inorganic substrate, comprising disposing a combination set of laminating materials including an inorganic substrate made of a semiconductor substrate or ceramic and auxiliary materials for a laminate working between upper and lower heat plates of a vacuum press machine and heating and pressurizing the combination set, wherein the vacuum press machine comprises as a pressurization system an air cylinder which drives a plunger by means of air pressure and, after the upper and lower heat plates which have been heated up to a predetermined temperature are brought into contact with the combination set disposed between the heat plates after or before the initiation of pressure reduction of a press atmosphere or under a reduced pressure, at least a low-pressure loading from the initiation of the pressurization to 0.05 MPa takes at least 10 seconds.

According to the present invention, secondly, there is provided a press machine comprising as essential components staybars, upper and lower frames, upper and lower heat plates, means for heating the upper and lower heat plates, pressure loading means to the upper and lower heat plates and a sealed pot having the sealing function of reducing a pressure in an atmosphere between the upper and lower heat plates, wherein the pressure loading means is an air cylinder supported and fixed on the upper portion of the upper frame, the air cylinder can control a plunger under a low pressure of 0.02 MPa or lower, the upper heat plate is connected to the shaft of the plunger and, when the upper heat plate descends, the air cylinder works as an air damper.

In the above press machine provided according to the present invention, preferably, the air cylinder is a two-level air cylinder switchable between a low pressure and a high pressure.

In the above method of press-working an inorganic substrate as the first invention provided according to the present invention, preferably, the vacuum press machine has the air cylinder above the upper heat plate and the upper heat plate descends due to its own weight with the aid of damper function of the air cylinder and is slowly brought into contact with the combination set.

In the above method of press-working an inorganic substrate as the first invention provided according to the present invention, preferably, the pressure loading is carried out by increasing the pressure up to a predetermined pressure in the range of from 0.05 to 5 MPa, more preferably from 0.1 to 1 MPa, after the low pressure loading and maintaining the predetermined pressure.

According to the present invention, further, there is provided a method of bonding and holding a semiconductor substrate to/on a holding substrate according to the above method of press-working an inorganic substrate, in which when the laminating materials are a semiconductor substrate (SE), a holding substrate (BP) and a thermoplastic resin (TP) which is disposed between the semiconductor substrate (SE) and the holding substrate (BP) and which the semiconductor substrate (SE) and the holding substrate (BP) are bonded with, the auxiliary materials are at least a laminating material positioning frame or a laminating material positioning die for disposing the laminating materials between the upper and lower heat plates through cushion materials.

According to the present invention, further, there is provided a method of producing a metal-foil-clad resin composite ceramic board according to the above method of press-working an inorganic substrate, in which when the laminating materials are a resin-impregnated ceramic substrate and a metal foil, the auxiliary materials are at least a laminating material positioning frame including a continuously porous material which laminating material positioning frame disposes the laminating materials between the upper and lower heat plates through cushion materials, has an initial thickness thicker than the thickness of the laminating materials and absorbs an excess resin.

BRIEF DESCRIPTION OF DRAWINGS

FIG. 1 shows a sectional view of the press machine of the present invention.

DETAILED DESCRIPTION OF THE INVENTION

The constitution of the present invention will be explained hereinafter.

First, the principle of the method of press-working an inorganic substrate, provided by the present invention, will be explained.

The present inventors have already proposed a process for the production of a metal-foil-clad resin composite ceramic board (U.S. Pat. Nos. 6,113,730 and 5,686,172). The above production process is characterized in that there is no distinguishable adhesive layer between a resin composite ceramic layer and a metal foil. Generally, an industrial laminate-formation method therefor, that is, a laminate-formation method using a conventional oil hydraulic vacuum press machine necessarily requires a reverse cushion frame made of paper, etc. The reverse cushion frame has the following functions of 1) to 3), 1) preventing the ununiformity of a press pressure loading,
2) preventing a rapid pressure loading onto laminating materials since the initial pressure is first absorbed with the reverse cushion frame, and
3) absorbing an excess resin.

1) can be achieved by using a material having almost no cushioning properties, such as die or positioning frame, is used when a material to be laminated has a uniform thickness. Further, 3) is not indispensable when no excess resin exists.

It may be possible to estimate that a press machine which can control a pressure in a minute range, for example a pressure of 0.01 MPa or less, can overcome the above 2). However, this estimation is incorrect. When a reverse cushion frame is not used, even a press machine which can do such a control causes a semiconductor substrate or a ceramic substrate to crack in most cases. The reverse cushion frame prevents a rapid pressure loading which is hard to control by a mechanical setting when an oil hydraulic vacuum press machine is used.

It is thought that the above rapid pressure loading to the laminating materials when an oil hydraulic vacuum press machine is used is caused mainly as follows.

At the instant when a contact state transfers to a pressure loading state, resistance of heat conduction from the heat plate to a combination set of laminating materials and resistance of heat conduction in the combination set of laminating materials decrease greatly. As a result, the combination set of laminating materials is heated rapidly and expanded thermally. The above thermal expansion naturally becomes a force to broaden the distance between the upper and lower heat plates. However, even if a conventional oil hydraulic vacuum press machine can control a remarkably minute pressure, the pressure generated from the combination set of laminating materials directly becomes a pressure (to be called "reverse pressure", hereinafter) to the combination set since the conventional oil hydraulic vacuum press machine does not have a system in which the distance between the upper and lower plates can be instantly broadened in response to the above pressure generated from the combination set of laminating materials.

The term that "a minute pressure control is possible" does not include the meaning that the above "reverse pressure" can be controlled. Therefore, even when a minute pressure control is possible, it is impossible to prevent the occurrence of a breakage.

It is estimated that this is based on the principle of a cylinder type pressure loading system using oil (liquid). The pressure control is carried out by an injection pressure of a liquid into a cylinder with a gear pump. The above pressure control is based on the premise that the injection pressure is directly proportional to the press pressure. Therefore, the followings can be said.

1) The generation of "reverse pressure" is not considered.
2) Therefore, there is no reverse-flow system of a fluid at the generation of "reverse pressure".
3) Further, even when a reverse-flow system is installed, there is a problem. When the injection fluid is a liquid (oil), the reverse pressure can be mainly resolved only by a reverse flow since the compressibility of a liquid (oil) is small. However, the response is poor.

From the above reasons, to decrease the "reverse pressure" itself becomes indispensable and a system or a control method to absorb the "reverse pressure" generated becomes indispensable. The above "reverse cushion" plays this role.

To this respect, an air cylinder which drives a plunger by means of an air pressure uses compressible air (gas) as a pressure fluid. Therefore, when the "reverse pressure" is generated, the air is easily compressed to absorb the reverse pressure. As a result, the pressure does not greatly come off from a predetermined pressure.

That is, when the rate of a pressure loading is slowed to a necessary and sufficient rate, the pressure becomes a pressure which is almost completely the same as a set pressure and no rapid increase or decrease occurs.

Next, the press machine of the present invention will be explained.

The present press machine is a press machine comprising as essential components staybars, upper and lower frames, upper and lower heat plates (8, 16), means for heating the upper and lower heat plates, pressure-loading means to the upper and lower heat plates and a sealed pot having the sealing function of reducing a pressure in an atmosphere between the upper and lower heat plates, wherein the pressure-loading means is an air cylinder supported and fixed on the upper portion of the upper frame, the air cylinder can control a plunger under a low pressure of 0.02 MPa or lower, the upper heat plate is connected to the shaft of the plunger and, when the upper heat plate descends, the air cylinder works as an air damper.

Further, the air cylinder is preferably a two-level air cylinder switchable between a low pressure and a high pressure.

An example of the present machine will be explained with reference to drawings. Symbols in drawings have the following meanings; 1: a high and low two-level air cylinder, 2: air cylinder for opening and closing a vacuum pot, 3: a vacuum packing, 4: a shaft, 5: an upper cover of a vacuum pot, 6: lower cover of a vacuum pot, 7: insulation, 8: an upper heat plate (with a temperature controller), 9: an upper plate, 11: a vacuum packing, 12: staybar, 13: an upper frame, 14: a lower frame, 15: an input aperture for materials and 16: a lower heat plate.

FIG. 1 shows an example of the press machine of the present invention.

In FIG. 1, materials to be press-worked are placed between upper and lower heat plates (8,16) from an input aperture (15) for materials to be press-worked. The materials are disposed or fixed in a predetermined position. Generally, the upper and lower heat plates (8,16) are heated up to a predetermined temperature before the materials are placed. Then, an upper cover (5) of a vacuum pot is moved down by means of air cylinders (2) and is brought into contact with a lower cover (6) and then a vacuum sealing is carried out. Further, the descend of the upper heat plate (8) is properly slowly carried out by means of damper function of an air cylinder (1) to bring the upper heat plate (8) into contact with the materials to be press-worked. After a press atmosphere reaches a predetermined degree of pressure reduction, the application of a low pressure is gradually carried out over a predetermined time by means of the air cylinder (1) and then the application of a high pressure is carried out.

In FIG. 1, the heat plates have only a heating system with an electrical heater and have no cooling system so that there is an advantage that a lighter upper heat plate can be prepared. When it is required to increase productivity by a rapider cooling, an opening is formed by raising the upper cover (5) of a vacuum pot and cooling is carried out by air blasting, etc., as required.

For enabling a press working at a maximum temperature of more than 350° C., it is preferred to provide thermal insulation between the heat plates and surroundings thereof with careful attention. In press-working, it is more preferred to initiate a pressure reduction at the instant when the upper cover (5) is brought into intimate contact with the lower cover (6), since insulation between the heat plates and the surroundings becomes sufficient.

In FIG. 1, further, the shape of a vacuum container, i.e., a vacuum pot is formed with a cylindrical upper cover (5), a cylindrical lower cover (6) and a seal therebetween. There is adopted a method in which the upper heat plate and the upper cover are respectively driven by different air plungers. In a press machine having a smaller size, since the weights of the upper heat plate and the upper cover can be decreased, a driving system for the upper cover can be added to a driving system for the heat plate.

There are cases such as a case in which the size of a vacuum machine is large, a case in which a higher pressure loading is enabled and a case in which a cooling system is added in addition to the heating system, although these cases are not shown in FIG. 1. In these cases, the weights of the upper plate (9) and the upper heat plate (8) become too heavy so that the load to be imposed on materials to be pressed becomes too large in some cases. As a result, it can be estimated that precise control of load becomes difficult. In such cases, load other than overload due to acceleration can be canceled by adding a canceling system of load. The upper heat plate (8) is installed on the upper plate (9) through an insulation (7). The term "upper plate" will sometimes mean both of the upper plate (9) and the upper heat plate (8) hereinafter.

The present press machine explained hereinbefore is characterized by the following 1) to 3), 1) the pressure loading means is an air plunger supported and fixed on the upper portion,
2) the air plunger can set and control a low pressure of 0.02 MPa or lower, and
3) the air plunger can work as an air damper while the upper plate is descending.

As described before, the above 1) enables the control of generation of "reverse pressure" due to thermal expansion, to enable a stable press-working. Further, according to 3), a descending speed is made constant, and an impact force is reduced to an appropriate extent when the heat plate comes into contact with the laminating materials.

Since the air cylinder is installed at the upper portion, pressure for supporting the heat plate is unnecessary so that more precise pressure control is enabled.

Next, laminating materials, etc., applicable to the present invention will be explained.

The semiconductor substrate is typified by silicon (Si) wafer. In addition to the silicon (Si) wafer, the semiconductor substrate includes element type semiconductor such as germanium (Ge), selenium (Se), tin (Sn), tellurium (Te), etc., and compound semiconductor such as gallium-arsenic (GaAs), GaP, GaSb, AlP, AlAs, AlSb, InP, InAs, InSb, ZnS, ZnSe, ZnTe, CdS, CdSe, CdTe, AlGaAs, GaInAs, AlInAs, AlGaInAs, etc. These semiconductors can be used as required.

Further, the ceramic substrate, i.e., inorganic continuously porous sintered body includes aluminum nitride (AlN), aluminum nitride-boron nitride (AlN-h-BN), silicon carbide (SiC), aluminum nitride-silicon carbide-boron nitride (AlN—SiC-h-BN), zirconium oxide-aluminum nitride-boron nitride ($ZrO_2$—AlN-h-BN), alumina-boron nitride ($Al_2O_3$-h-BN), alumina-titanium oxide-boron nitride ($Al_2O_3$—$TiO_2$-h-BN), and silicon nitride-boron nitride ($Si_3N_4$-h-BN), amorphous carbon and carbon fiber reinforced carbon.

According to the results of tests in which the present press machine was used, the thermoplastic resin used for bonding include polyimide, polyetherimide, polyamide imide, polyether ketone, polyamide and ethylene-vinylalcohol copolymer, and, in addition to these resins, usable examples of the thermoplastic resin include polyethylene, polypropylene, 4-methylpentene-1, other polyolefines, polyvinylidene fluoride, cellulose triacetate, tetrafluoroethylene-perfluoroarylvinylether copolymer (PFA), polyvinylidene fluoride (PVDF), tetrafluoroethylene-hexafluoropropylene copolymer (FEP), polychloro-trifluoroethylene copolymer (PCTFE) and chlorotrifluoroethylene-ethylene copolymer (E/CTFE) which are usually known as a film for separating.

The method of using the above resins includes (1) a method in which a 10 to 100 μm thick film manufactured beforehand is used, or (2) a method in which a resin solution is applied by a thin film formation method such as spin coating and dried to form a film having a thickness of 20 μm or less, more preferably 10 μm or less.

The bonding is carried out with a method which is properly selected from the above methods. Otherwise, there is adopted a bonding and holding method in which a thin film is formed on the entire surface by application (above (2)) and a ring film is used on the periphery (above (1)). Further, although it is preferred to properly select the thickness of the thermoplastic resin as required in consideration of surface roughness degree of a protective surface (surface A of semiconductor substrate), etc., the thickness is preferably 10 μm or more, more preferably 15 μm or more, in view of protection from damage because of pressure or the like. When it is required to finish surface B of a semiconductor substrate with high surface accuracy (the surface roughness of surface A of a semiconductor substrate is naturally small), it is preferred to use a thermoplastic resin having a thickness of 10 μm or less.

EXAMPLES

The present invention will be concretely explained with reference to Examples hereinafter.

Example 1

A disc of an aluminum nitride-boron nitride porous sintered body which disc had a thickness 0.625 mm and a diameter 150.5 mm was surface-treated by heat-treatment and pyrolysis with an aluminum compound, the surface-treated disk was impregnated with a resin, the impregnated-resin was cured by vacuum press, the surface of the resin-cured disk was polished so as to attain a surface roughness Ra=0.23 μm, and a 25 μm thick thermoplastic polyimide resin (trade name: Yupirex VT441S, supplied by Ube Industries, Ltd) was temporarily bonded to one surface of the polished disk, to prepare a holding substrate A silicon wafer having a thickness of 0.625 mm and a diameter of 150.0 mm was prepared as a semiconductor substrate.

Bonding of the semiconductor substrate to the holding substrate was carried out with the novel vacuum press machine explained in the above Detailed Description of the Invention.

The above vacuum press machine had a two-level air compression system switchable between a low-pressure compression and a high-pressure compression for press pressure loading. An air compressor was installed at an upper portion of the press upper plate and the air compressor was used as a descending compression system for the upper plate. In the above air compression system for the upper plate, further, it was possible to set a damper function for greatly slowing a descending speed of the upper plate when the upper plate descended. The vacuum press machine was able to perform a press a temperature of up to 350° C.

The upper and lower heat plates of the present vacuum press machine moved to open a space between the upper and lower heat plates, a cushion set obtained by sandwiching a heat-resistant cushion material having a thickness of 2.0 mm and a square size of 240 mm×240 mm between two aluminum alloy plates having a thickness of 0.4 mm and a square size of 250 mm×250 mm was placed on the lower heat plate, and a positioning plate obtained by making a hole having a diameter of 160 mm in the center of an aluminum alloy plate having a thickness of 0.8 mm and a square size of 250×250 mm was placed thereon Further, a cushion set obtained by sandwiching a heat-resistant cushion material having a thickness of 2.0 mm and a square size of 240 mm×240 mm between two aluminum alloy plates having a thickness of 0.4 mm and a square size of 250 mm×250 mm was fixed to the upper heat plate.

The upper plate and the upper heat plate descended gradually due to their own weights with the aid of the air compression system as a damper, to bring the cushion set fixed to the upper heat plate into contact with the positioning plate on the lower cushion set. In this state where the upper cushion set was in contact with the positioning plate on the lower cushion set, the press upper and lower heat plates were preliminarily heated up to 320° C.

The upper plate was moved up while keeping its temperature of 320° C. Two polyimide film sheets (trade name: KAPTON•film, supplied by Du Pont-Toray Co., LTD.) having a diameter of 155 mm and a thickness of 100 μm each were placed in the hole of the positioning plate, the silicone wafer (SE) was placed on the two polyimide film sheets such that the non-polished surface (lower side) of the silicon wafer (SE) was in contact with the polyimide film, and the holding substrate (BP) was placed on the silicon wafer (SE) such that the surface of the holding substrate (BP) which surface the thermoplastic polyimide film was temporarily bonded to was the lower side.

Next, the upper plate was allowed to descend gradually due to its own weight with the aid of the air compression system as a damper, to bring the cushion set fixed to the upper heat plate into contact with the holding substrate (BS), and the vacuum pot of the press machine was closed. The pressure reduction in a press atmosphere was initiated.

Then, pressurization was initiated and the pressure was increased up to 0.0475 MPa over 30 seconds by means of a low-pressure cylinder of the air compression system. After the above pressure was maintained for 10 seconds, the low-pressure cylinder was switched to a high-pressure cylinder. The pressure was increased up to 0.2 MPa over 1 minute. The above pressure of 2 MPa was maintained for 14 minutes to bond the semiconductor substrate to the holding substrate. The minimum pressure in the atmosphere in the press machine was 0.7 kPa.

The heating was terminated, a nitrogen gas was introduced into the press machine and the inside was cooled. When the pressure in the press machine became atmospheric pressure, the vacuum pot was opened. The upper plate was moved up and the bonding product was taken out.

Although the bonding product was in a remarkably excellent bonding state without any cracks, a warp having a convex on the silicone wafer side was found. The bonding product was placed on the table of a three-dimensional measuring machine with an assistant tool such that the silicon wafer (SE) side was the lower side. Many points on the upper surface side were measured and a distance (lifted quantity at ends or concave quantity in the center portion: warp quantity) between the straight line which connected both ends and the center portion (the most concave point in this case) was measured. The distance was 230 μm.

Example 2

Example 1 was repeated except that the cushion set of the aluminum alloy plates and the cushion material on the lower side and the positioning plate were replaced with a material obtained by making a cut hole of which a vertical section was a part of a circular arc, of which the diameter was 160 mm, of which the depth of the center portion was 1.8 mm and of which the depth of end portions was 0.8 mm in a 3-mm thick aluminum alloy plate.

As a result, a bonding product was obtained in a remarkably excellent bonding state without any cracks. The silicon wafer side of the bonding product was convex. The warp quantity was 110 μm.

Example 3

Example 1 was repeated except that there was used, as a holding substrate, a material obtained by temporarily bonding a 30 μm thick thermoplastic polyamide (nylon-6) to one surface of a disk material (surface roughness Ra=0.22 μm) obtained from an alumina-zirconia type porous sintered body disc having a thickness of 1.0 mm and a diameter of 125.0 mm, that a gallium-arsenic wafer having a thickness of 0.625 mm and a diameter of 100.0 mm was used as a semiconductor substrate, and that the press bonding was carried out under conditions of 230° C./15 minutes.

Although the bonding product was in a remarkably excellent bonding state without any cracks, a slight warp was found. The gallium-arsenic wafer side was convex. The warp quantity was 50 μm.

Effect of the Invention

According to the present invention, there can be provided a machine for press-working an inorganic substrate made of a fragile and breakable semiconductor substrate or ceramic under heat without any special skill and a press method therefor. As a result, bonding and holding of the semiconductor substrate to/on a holding substrate by pressurization and heating, laminate-formation of a ceramic substrate, and the like, can be carried out with a high degree of reliability. The method and the press machine of the present invention have remarkably high industrial significance.

What is claimed is:

1. A method of press-working an inorganic substrate, comprising disposing a combination set of laminating materials including an inorganic substrate made of a semiconductor wafer substrate or an inorganic continuously porous sintered substrate and auxiliary materials for a laminate working between upper and lower heat plates of a vacuum press machine which comprises as essential components staybars, upper and lower frames, upper and lower heat plates, means for heating the upper and lower heat plates, pressure loading means to the upper and lower heat plates and a sealed pot having the sealing function of reducing a pressure in an atmosphere between the upper and lower heat plates, and heating and pressurizing the combination set, wherein the vacuum press machine comprises as a pressurization system an air cylinder which drives a plunger by means of air pressure and, the upper and lower heat plates which have been heated up to a predetermined temperature are brought into contact with the combination set disposed between the heat plates after or before the initiation of pressure reduction of a press atmosphere or at a reduced pressure and then a low-pressure loading from the initiation of the pressurization to 0.05 MPa takes at least 10 seconds at the reduced pressure.

2. The method of press-working an inorganic substrate according to claim 1, wherein the air cylinder is supported and fixed on an upper portion of the upper frame, as shaft of the plunger of the air cylinder is connected to the upper heat plate, and the contact of the upper heat plate and the combination set is slowly carried out by moving the upper heat plate downward due to its own weight with the aid of damper function of the air cylinder.

3. The method of press-working an inorganic substrate according to claim 1, wherein the pressure loading is carried out by increasing the pressure up to a predetermined pressure in the range of from 0.05 to 5 MPa after the low pressure loading and maintaining the predetermined pressure.

4. The method of press-working an inorganic substrate according to claim 1, wherein, when the laminating materials are a semiconductor substrate (SE), a holding substrate (BP) and a thermoplastic resin (TP) which is disposed between the semiconductor substrate (SE) and the holding substrate (BP) and which the semiconductor substrate (SE) and the holding substrate (BP) are bonded with, the auxiliary materials are at least a laminating material positioning frame or a laminating material positioning die for disposing the laminating materials on the lower heat plate through a cushion material.

5. The method of press-working an inorganic substrate according to claim 1, wherein, when the laminating materials are a resin-impregnated ceramic substrate and a metal foil, the auxiliary materials are at least a laminating material positioning frame including a continuously porous material which laminating material positioning frame disposes the laminating materials on the lower heat plate through a cushion material and a metal plate, has an initial thickness thicker than the thickness of the laminating materials and absorbs an excess resin.

* * * * *